(12) United States Patent
Stoll et al.

(10) Patent No.: US 9,793,445 B2
(45) Date of Patent: Oct. 17, 2017

(54) METHOD OF MANUFACTURING OPTOELECTRONIC COMPONENTS AND DEVICE FOR MANUFACTURING OPTOELECTRONIC COMPONENTS

(71) Applicant: OSRAM Opto Semiconductors GmbH, Regensburg (DE)

(72) Inventors: Ion Stoll, Tegernheim (DE); Hans-Christoph Gallmeier, Regensburg (DE); Claudia Jurenka, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/400,668

(22) PCT Filed: May 24, 2013

(86) PCT No.: PCT/EP2013/060737
§ 371 (c)(1),
(2) Date: Nov. 12, 2014

(87) PCT Pub. No.: WO2013/174977
PCT Pub. Date: Nov. 28, 2013

(65) Prior Publication Data
US 2015/0155446 A1 Jun. 4, 2015

(30) Foreign Application Priority Data
May 25, 2012 (DE) .......... 10 2012 208 900

(51) Int. Cl.
*H01L 33/50* (2010.01)
*B05B 5/00* (2006.01)
(Continued)

(52) U.S. Cl.
CPC ............ *H01L 33/50* (2013.01); *B05B 5/00* (2013.01); *B05B 5/005* (2013.01); *B05B 5/006* (2013.01);
(Continued)

(58) Field of Classification Search
CPC .................................. H01L 2933/041
See application file for complete search history.

(56) References Cited

U.S. PATENT DOCUMENTS

2002/0149313 A1* 10/2002 Yonekura ............ B05B 5/0255
313/500
2008/0150416 A1  6/2008 Maruyama et al.
(Continued)

FOREIGN PATENT DOCUMENTS

DE   11 2006 002 251 T5   6/2008
DE   10 2011 111 980 A1   2/2013
(Continued)

OTHER PUBLICATIONS

English translation of the Notice to File a Response dated Dec. 2, 2015 of corresponding Korean Application No. 10-2014-7036341.

*Primary Examiner* — Michael Carter
(74) *Attorney, Agent, or Firm* — DLA Piper LLP (US)

(57) ABSTRACT

A method of manufacturing optoelectronic components includes spraying a fluorescent layer of an optoelectronic component onto a substrate, the substance or the substance mixture of the fluorescent layer including an electric charge when sprayed on, and wherein the electrically charged substance or the at least partially electrically charged substance mixture includes a larger electric potential when the fluorescent layer is sprayed on than at least one area of the substrate; and locally adjusting the thickness of the fluores- (Continued)

cent layer of the sprayed-on fluorescent substance when spraying on the fluorescent layer onto the substrate by an electric potential gradient.

14 Claims, 4 Drawing Sheets

(51) Int. Cl.
*B05B 5/025* (2006.01)
*B05B 5/16* (2006.01)

(52) U.S. Cl.
CPC .......... *B05B 5/0255* (2013.01); *B05B 5/1608* (2013.01); *B05B 5/1675* (2013.01); *H01L 2933/0041* (2013.01)

(56) References Cited

U.S. PATENT DOCUMENTS

| | | | |
|---|---|---|---|
| 2008/0150975 A1* | 6/2008 | Ueno | .................. B41J 2/04576 347/9 |
| 2009/0230222 A1* | 9/2009 | Kim | ........................ B05B 5/001 239/690.1 |
| 2010/0109508 A1* | 5/2010 | Okuyama | .......... C09K 11/0883 313/486 |
| 2010/0119839 A1 | 5/2010 | Chen | |
| 2013/0076230 A1 | 3/2013 | Watanabe et al. | |

FOREIGN PATENT DOCUMENTS

| | | |
|---|---|---|
| JP | 2008-135539 | 6/2008 |
| WO | 2006/034663 A1 | 4/2006 |

* cited by examiner

METHOD OF MANUFACTURING OPTOELECTRONIC COMPONENTS AND DEVICE FOR MANUFACTURING OPTOELECTRONIC COMPONENTS

TECHNICAL FIELD

This disclosure relates to a method of manufacturing optoelectronic components and a device for manufacturing optoelectronic components.

BACKGROUND

To generate white light by a light-emitting diode (LED), a semiconductor chip is conventionally used which emits a narrow-band blue light. Portions of the emitted blue light are converted into yellow and red light components by a converter, e.g., in the form of particles, e.g., fluorescent particles. White light may be generated from the color mixture of unconverted blue light and converted yellow and red light. For the light conversion and generation of the color mixture, the converter particles should be in the optical path, i.e., the optical path of the emitted light of the LED.

A conventional method of generating converter particles in the optical path of an LED is volume casting in which converter particles are distributed within a silicone matrix, the silicone matrix being, e.g., distributed around the LED.

A further conventional method to generate converter particles within the optical path of an LED is the use of fluorescent layers comprising fluorescent substances in a silicone matrix and being produced by a screen process. These fluorescent layers may then be fixed to an LED, e.g., by a glue.

A further conventional method of generating converter particles in the optical path of an LED is electrophoretic deposition of fluorescent layers on an LED.

A further conventional method of generating converter particles in the optical path of an LED consists in spraying fluorescent substances or, respectively, converter particles onto a substrate, e.g., a semiconductor chip, e.g., an LED. Thereby, a suspension or dispersion of a fluorescent substance in a low viscous matrix, e.g., a silicone material or an epoxy resin in an uncured state, is sprayed onto a substrate through a nozzle by over pressure. By repeatedly spraying the substrate with the fluorescent suspension or fluorescent dispersion, the layer thickness of the matrix containing the fluorescent substance and thus the chromaticity coordinate or, respectively, the color mixture of the emitted light may be adjusted. The spraying-on of the fluorescent suspension or fluorescent dispersion may be set up for one single LED, a panel of several, e.g., several hundred, LEDs or a chip wafer, wherein the LEDs on the panel or chip wafer may be singularized upon being sprayed with on the fluorescent substances.

Due to the spraying, the fluorescent layer on a panel or chip wafer may exhibit inhomogeneities, e.g., differing chromaticity coordinates, i.e., the emitted color (color mixture) may have different configurations for the LEDs on a panel or a chip wafer. The reason for the inhomogeneity of the chromaticity coordinate on a panel or chip wafer may be spreading or segregation of already sprayed-on fluorescent material, which may locally result in the forming of different thicknesses of the fluorescent layer on the substrate. A spreading of the sprayed-on layers when the matrix is in an uncured state, e.g., silicone or epoxy resin in an uncured state, may be configured by the viscosity of the substance of the matrix.

The matrix material should be as highly viscous as possible, but still sprayable, wherein the fluorescent suspension or dispersion becomes more difficult with increasing viscosity of the fluorescent suspension or fluorescent dispersion.

Furthermore, fluorescent particles already deposited on the substrate may be removed and/or shifted by the impulse of further sprayed-on fluorescent particles. Moreover, the result may be an agglomeration, i.e., an accumulation, clustering or clotting of fluorescent particles. Furthermore, it may be difficult to provide more complex substrate kinds such as an LED housing or package with a fluorescent layer by spraying. Due to the above-mentioned problems, process control may be exacerbated, thus reducing reproducibility and homogeneity of the color distribution in a finished product. Furthermore, highly viscous substances may not be used for the matrix in the targeted range of thickness of the fluorescent layer, i.e., in an area of approximately 100 nm to approximately 200 μm.

SUMMARY

We provide a method of manufacturing optoelectronic components including spraying a fluorescent layer of an optoelectronic component onto a substrate, the substance or the substance mixture of the fluorescent layer including an electric charge when sprayed on, and wherein the electrically charged substance or the at least partially electrically charged substance mixture includes a larger electric potential when the fluorescent layer is sprayed on than at least one area of the substrate, and locally adjusting the thickness of the fluorescent layer of the sprayed-on fluorescent substance when spraying on the fluorescent layer onto the substrate by an electric potential gradient.

We also provide a method of manufacturing optoelectronic components including spraying a fluorescent layer of an optoelectronic component onto a substrate, the substance or the substance mixture of the fluorescent layer including an electric charge when sprayed on, and wherein the electrically charged substance or the at least partially electrically charged substance mixture includes a larger electric potential when the fluorescent layer is sprayed on than at least one area of the substrate, and locally adjusting the thickness of the fluorescent layer of the sprayed-on fluorescent substance when spraying on the fluorescent layer onto the substrate by an electrical potential gradient, the substance or substance mixture is deposited on the substrate by a nozzle, and the substance or substance mixture is sprayed from the nozzle by pressure.

We further provide a device that manufactures an electronic component including equipment that generates an electric potential difference; a substrate holder that holds a substrate; and equipment that sprays on an electrically charged substance or an at least partially electrically charged substance mixture, configured to adjust the thickness of the sprayed-on electrically charged or the sprayed-on at least partially electrically charge substance mixture by various electrical changes of potential on the substrate.

BRIEF DESCRIPTION OF THE DRAWINGS

In the following, examples will be explained in more detail in conjunction with the drawings.

DETAILED DESCRIPTION

Figure 1:
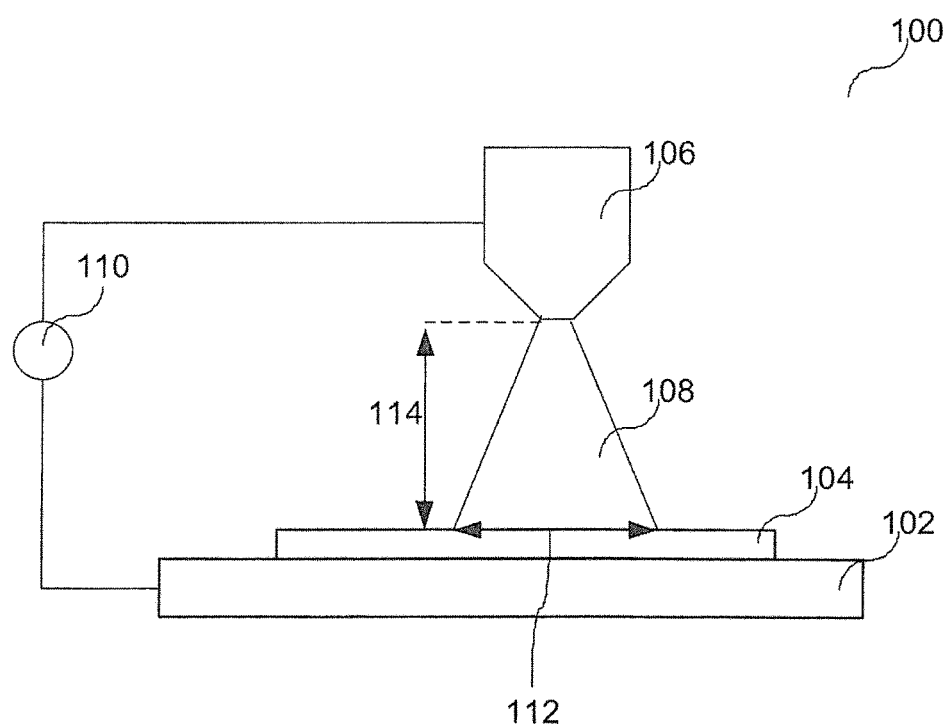
FIG. 1 shows a schematic cross-sectional view of a device for producing layers of optoelectronic components, according to various examples.

We provide various methods of manufacturing optoelectronic components and devices for manufacturing optoelectronic components, by which fluorescent layers of optoelectronic components may be produced which are more homogenous in themselves, even on geometrically complex substrates.

An organic substance may be a chemically uniform carbon compound with characteristic physical and chemical properties, regardless of the respective state of matter. An inorganic substance may furthermore be a chemically uniform carbon-less compound or simple carbon compound with characteristic physical and chemical properties, regardless of the respective state of matter. An organic-inorganic (hybrid) substance may be a chemically uniform compound having compound portions containing carbon as well as carbon-less portions, both with characteristic physical and chemical properties, regardless of the respective state of matter. The term "substance" comprises all above-mentioned substances such as an organic substance, an inorganic substance and/or a hybrid substance. A substance mixture may furthermore comprise components of two or more differing substances, the components of which are, e.g., very finely distributed. A class of substances is supposed to comprise a substance or a substance mixture of one or a plurality of organic substance(s), one or a plurality of inorganic substance(s) or one or a plurality of hybrid substance(s). The term "material" may be used as a synonym for the term "substance."

An electric potential may be the electric potential energy of an electric charge with regard to the position of the electric charge with regard to oppositely charged electrodes. The electric field in which an electrically charged substance or an at least partially electrically charged substance mixture is located may in this context also be configured by another electrically charged substance or an at least partially electrically charged substance mixture.

We provide methods of manufacturing optoelectronic components comprising: spraying a fluorescent layer of an optoelectronic component onto a substrate, the substance or the substance mixture of the fluorescent layer comprising an electric charge when sprayed on, and wherein the electrically charged substance or the at least partially electrically charged substance mixture comprises a larger electric potential when the fluorescent layer is sprayed on than at least one area of the substrate; and the thickness of the fluorescent layer of the sprayed-on fluorescent substance being locally adjusted by an electric potential gradient on the substrate when spraying on the fluorescent layer.

In an example of the method, the optoelectronic components may, e.g., be configured as light-emitting diodes or laser diodes.

In another example of the method, the substrate may be configured as a chip wafer, a wire-bonded ceramic substrate, a lead frame or a similar substrate.

The substrate may be configured as an at least partially configured optoelectronic component. In this context, a partially configured optoelectronic component may be only partially configured with regard to the completely finished optoelectronic component. A partially configured optoelectronic component as such may accordingly be considered as a fully completed component, however, with regard to different target properties. In this context, a provided carrier of an optoelectronic component may already be considered as a partially configured optoelectronic component if an optoelectronic component is being configured on the carrier.

The substrate may be set up such that one single optoelectronic component or several optoelectronic components arranged side-by-side may be configured therefrom or thereon. One single optoelectronic component may, e.g., be a singularized chip. Several optoelectronic components arranged side-by-side may, e.g., be several optoelectronic components on a chip wafer or a panel.

The substance mixture deposited on the substrate may comprise a matrix with a fluorescent substance embedded therein, e.g., a suspension or dispersion. By chemical curing a part of the sprayed-on substance or substance mixture and/or evaporation or, respectively, vaporization of volatile portions of the sprayed-on substance mixture, e.g., the viscosity of the sprayed-on substance or substance mixture may be increased.

A fluorescent substance may, e.g., comprise or consist of $Ce^{3+}$-doped garnets such as YAG:Ce and LuAG, e.g., $(Y, Lu)_3(Al,Ga)_5O_{12}:Ce^{3+}$; $Eu^{2+}$-doped nitrides, e.g., $CaAlSiN_3:Eu^{2+}$, $(Ba,Sr)_2Si_5N_8:Eu^{2+}$; $Eu^{2+}$-doped sulfides, SIONe, SiAlON, orthosilicates, e.g., $(Ba,Sr)_2SiO_4:Eu^{2+}$; chlorosilicates, chlorophosphates, BAM (barium magnesium aluminate:Eu) and/or SCAP, halophosphate.

In yet another example of the method, the substance of the matrix of the substance mixture may comprise or consist of a volatile solvent, e.g., a solvent suspension or a solvent dispersion.

The fluorescent substance may also be deposited on the substrate from a volatile matrix as a layer without surrounding matrix. Thereby, the heat dissipation of the Stokes heat generated in a fluorescent substance for wavelength conversion may be improved. In this context, the Stokes heat may be considered to be the energy difference between the electromagnetic radiation absorbed by the fluorescent substance and the electromagnetic radiation emitted by the fluorescent substance.

The volatile solvent may be vaporized and/or may escape from the surface of the substrate by a negative pressure and/or by heating the sprayed-on layer and/or by heating the substrate.

The matrix material of the sprayed-on substance mixture may be set up such that the substance of the matrix is solidified after being sprayed on the substrate.

An increase in viscosity, i.e., solidifying of the sprayed-on substance or substance mixture may, e.g., be achieved by an unlinked polymer such as an epoxy resin, a silicone or a substance mixture with one of these substances comprising a fluorescent substance and/or substance mixture with volatile components, e.g., in a solution, suspension or dispersion may be provided or configured.

The substance of the matrix may comprise or be configured of a substance from the following group of substances: silicone, lacquer or epoxy resin.

The substance or substance mixture may be deposited on the substrate by a nozzle.

In this context, the opening of the nozzle may have a diameter of about 20 µm to about 0.6 mm. The opening diameter of the nozzle may be set depending on the viscosity of the substance or substance mixture, on the size of possible particles in the substance or substance mixture and the applied pressure.

The substance or substance mixture may be sprayed from the nozzle by pressure. An overpressure may for instance be set by a pump. A negative pressure may, e.g., be set by evacuating the space between the nozzle and the substrate. The pressure used to spray the substance or substance mixture through the nozzle may have a value of about 0.1 bar to about 10 bar. The substance or, respectively, the substance mixture may form a divergent jet. The divergent jet is in this context directed to the substrate surface to be coated.

The substrate and the nozzle may be shifted relative to each other to spray the fluorescent substance onto the substrate, e.g., by mounting the nozzle and/or the substrate or, respectively, the substrate holder in a moveable manner.

The shift may, e.g., be implemented in an electrical manner, e.g., by electric motors, or in an electronic manner, e.g., by computer-controlled electric motors.

The surface of the jet on the substrate surface may be adjusted by changing the distance between the nozzle and the substrate.

The distance between the nozzle and the substrate surface may have a value about 0.5 cm to about 30 cm, e.g., about 1 cm.

The surface of the jet on the substrate surface may be adjusted by changing the jet profile.

The electric potential difference of the electrically charged substance or of the at least partially electrically charged substance mixture may be configured by a voltage source, wherein a first electrode and a second electrode are electrically connected to the voltage source, with the electric potential difference of the electrically charged substance or of the at least partially electrically charged substance mixture being configured between the first and the second electrode.

The voltage source may be configured such that the value of the potential difference of the electrically charged substance or of the at least partially electrically charged substance mixture may be set statically or changed dynamically.

The voltage may have a value of about −40 kV to about +40 kV, e.g., of about −2 kV to about +2 kV, e.g., of about −400 V to about +400 V, e.g., of about −50 V to about +50 V.

The driving force for an electrically charged substance or for the at least partially electrically charged substance mixture may be the electric field, e.g., between the electrodes. In this context, the electric field may correspond to the local change of the electric potential. When suitably choosing the electric potential of the substrate and of the sprayed-on electrically charged substance or of the sprayed-on at least partially electrically charged substance mixture such as a fluorescent substance, the fluorescent substance may be attracted to and held on the surface in an electrical manner, e.g., in an electrostatic manner.

The substrate may already comprise parts of an electrically charged fluorescent layer, wherein parts of the already sprayed-on electrically charged fluorescent layer and the substrate may comprise different charges.

In addition, the electrically attracted substance may have an electrically insulating effect on further sprayed-on substances. A further sprayed-on substance such as a further fluorescent substance may accumulate on the substrate surface in a preferably local manner at a position at which no or little electrically charged substance, e.g., electrically charged fluorescent substance, has been deposited.

This means that the electrically charged substance to be sprayed on or the electrically charged substance mixture to be sprayed on may have the same or a similar charge as parts of the substrate. However, the surface may have at least one area with a lower electric potential than the electrically charged substance to be sprayed on or the electrically charged substance mixture to be sprayed on. The electric potential of the at least one area of the substrate may additionally have a lower electric potential than adjacent areas of the substrate surface.

In other words, the electric field strength, i.e., the local change of the electric potential on the substrate surface may cause a local adjustment of the layer thickness.

The fluorescent layer of the electrically charged substance or of the at least partially electrically charged substance mixture may be configured between the first and the second electrode during spraying and configuring, with the second electrode being set up by the substrate and/or by an electrode behind or below the substrate and the first electrode being arranged in parallel to the second electrode.

An electrode behind or below the substrate, e.g., an electrically charged substrate holder and/or an electrostatic charging of the substrate may, e.g., be configured in an electrically non-conductive substrate such as the surfaces of a sapphire semiconductor chip or of a conductive but not grounded semiconductor chip, chip wafer or panel.

The nozzle that sprays the substance or the substance mixture onto the substrate may be configured as the first electrode.

The electric potential difference may be configured by an electrically charged atomized substance or an at least partially electrically charged atomized substance mixture and an earthed substrate. The electrically charged particles of the electrically charged atomized substance or of the at least partially electrically charged atomized substance mixture may then be deposited on the substrate under the influence of an electric field, e.g., of other electrically charged particles. On the surface of the substrate, the position of the charged particles may be influenced such that the electric potential of the electrically charged particles on the substrate surface is minimized in the electric field. In other words, the charged particles reach areas having a higher field strength on the substrate surface, e.g., areas having a lower electrical insulation. In this context, the insulation may be formed by the already sprayed-on substance or substance mixture.

The electrically charged substance or the at least partially electrically charged substance mixture or at least a part of the partially electrically charged substance mixture may have an intrinsic electric charged. Atomized particles of the substance or substance mixture such as fluorescent particles may, e.g., have en electric surface charge.

The substance or the substance mixture or a part of the substance mixture may be electrostatically charged prior to or during spraying onto the substrate. The atomized substance or parts of the atomized substance mixture, e.g., particles, e.g., fluorescent particles, may, e.g., be electrostatically charged by the electric potential of the nozzle and/or by friction occurring during spraying.

The electric potential difference of the electrically charged substance or of the at least partially electrically charged substance mixture may be configured by electrostatic charging of the substrate holder and/or of the substrate.

The jet area on the substrate surface may be set by ray optics between the nozzle and the substrate surface, the shape of the jet of the substance or substance mixture being changeable by the ray optics, wherein the area of the sprayed-on substance or substance mixture on the substrate surface may be adjusted by the jet shape, e.g., by focussing or collimating the jet. On the substrate, the jet may have an area which may be adjusted by the image distance and the ray optics, e.g., by the focal distance and the effect of the lens on the jet, e.g., a collecting or diffusing effect.

By the ray optics, the area on the substrate surface sprayed with the electrically charged substance or the at least partially electrically charged substance mixture may be adjusted specifically to, e.g., deposit a fluorescent substance only on small, selected areas of a substrate, e.g., to not spray the ceramic rims of a panel with fluorescent substance or to compensate for inhomogeneities of the layer thickness of the sprayed-on layer.

The adjustment of the surface by ray optics may be coupled to the pressure value of the substance or substance mixture sprayed from the nozzle.

The opening angle of the jet and/or the jet diameter may be modified by the ray optics.

The jet shape of the substance or substance mixture when spraying the substance or substance mixture may be configured by a static electric field, a dynamic electric field, an electromagnetic field or an earthing.

The ray optics may be configured depending on the composition of the atomized electrically charged substance or of the atomized, at least partially electrically charged substance mixture or, respectively, on the composition of the substrate by a static or dynamic electric or, respectively, magnetic field. In this context, a different electromagnetic potential may be applied between the nozzle and the substrate than at the ray optics, and thus, the divergent jet may be modulated, e.g., the ray optics may be earthed, i.e., connected to ground, and a voltage may be applied between the nozzle and the substrate, e.g., according to one of the configurations according to the description of FIG. 1.

The ray optics may comprise one or more electromagnetic lenses.

The ray optics may be electrically or electronically moved when spraying the substance or substance mixture onto the substrate surface.

In this context, the movements of the ray optics may be configured in parallel, perpendicularly or at an angle, e.g., diagonally, with regard to the substrate surface.

The ray optics may be configured as a first metallic plate and a second metallic plate, wherein the metallic plates may be arranged coplanarly with a distance to each other, the jet running between the plates.

The metallic plates may comprise or be configured of metals and/or precious metals as material or alloy such as Fe, Cu, Au, Ag, Pt, Pd, Al, Ti or C (graphite) and have a size of about 25 cm$^2$ to about 250 cm$^2$, e.g., 100 cm$^2$, wherein the metallic plates may be coplanarly arranged with regard to each other.

The two metallic plates may be configured such that an electric potential difference, i.e., an electric field is generated between the two plates. However, both plates may have the same electric potential, e.g., be connected to ground. In a differing electric potential between the plates, e.g., the first metallic plate may be earthed, i.e., connected to ground, while the second metallic plate may be connected to a voltage source. The electric field between the first metallic plate and the second metallic plate may be configured statically or dynamically and be configured to modulate the jet of the atomized electrically charged substance or substance mixture.

The plates may be spaced apart from each other by about 10 mm to about 20 cm; the distance to the nozzle may be about 5 mm to about 5 cm, and the distance to the substrate surface may be about 1 mm to about 1 cm, e.g., about 1 cm.

The first metallic plate may have the same or a different electric potential than the second metallic plate.

The ray optics may comprise a metallic ring, wherein the ring may be electrically connected with another voltage source and wherein the jet runs through the ring opening. The ring, however, may be connected to ground, i.e., it may be earthed. The metallic ring may comprise or be configured of a metal or precious metal as a material or alloy such as Fe, Cu, Au, Ag, Pt, Pd, Al, Ti, or C (graphite), the inner diameter being about 1 mm to about 10 cm and the outer diameter being about 1 mm to about 10 cm, with a thickness of about 1 mm to about 3 cm. The metallic ring may have a distance to the nozzle of about 1 mm to about 5 cm, and the distance to the substrate surface may be about 1 mm to about 5 cm, e.g., about 1 cm.

The shape of the jet may additionally be adjusted by at least one electrically acting blind and/or a mechanically acting blind.

The amount of the electrically charged substance or of the at least partially electrically charged substance mixture which is locally deposited on the substrate surface and/or on the area of the jet on the substrate surface may be coupled to a measurement of the local layer thickness of the fluorescent layer of the already sprayed-on, electrically charged substance and/or of the at least partially electrically charged substance mixture.

Compensation of the inhomogeneities of the layer thicknesses of the fluorescent layer may, e.g., be carried out after a first spraying process and local measurement of the thickness of the fluorescent layer already sprayed onto the substrate surface. In a second spraying process, the amount of electrically charged substance or of the at least partially electrically charged substance mixture which is deposited locally may be locally adjusted by the measured layer thickness information and by the ray optics. The area of the jet may be adjusted dynamically by the ray optics, the potential difference and the distance between the ray optics and the substrate.

Various examples provide a device to generate layers of optoelectronic components, the device comprising an equipment for generating an electric potential difference; a substrate holder to hold a substrate; an equipment to spray on an electrically charged substance or an at least partially electrically charged substance mixture, configured to adjust the thickness of the sprayed-on electrically charged substance or of the sprayed-on at least partially electrically charged substance mixture on the substrate by differing electric potential changes on the substrate; the equipment to spray on a substance or a substance mixture forming a jet, the jet comprising or consisting of the electrically charged substance or the at least partially electrically charged substance mixture; the jet being directed to the substrate surface and covering a first area on the surface; the thickness of the layer of the substance or substance mixture sprayed onto the substrate being locally adjusted by the potential difference.

The optoelectronic components may, e.g., be configured as light-emitting diodes or laser diodes.

The substrate may comprise a chip wafer or a wire-bonded ceramic substrate, a lead frame or a similar substrate.

The substrate may be configured as an at least partially finished optoelectronic component.

The substrate may be configured such that one single optoelectronic component or several optoelectronic components are configured therefrom or thereon in a side-by-side manner.

The at least partially electrically charged substance mixture deposited on the substrate may comprise a matrix and a fluorescent substance embedded therein.

The matrix material of the sprayed-on substance mixture may comprise or be composed of a volatile solvent.

The device may be configured such that the volatile solvent vaporizes and/or escapes from the substrate surface by a negative pressure and/or heating the sprayed-on layer and/or heating the substrate.

The matrix substance of the sprayed-on substance mixture may be configured such that the matrix may be solidified after being sprayed onto the substrate.

The matrix substance may comprise or be composed of a substance from the substance group comprising: silicone, lacquer or epoxy resin.

The equipment for spraying on the substance or substance mixture may comprise a nozzle to generate the jet of the substance or substance mixture.

The device may be configured such that the electric potential difference of the electrically charged substance or of the at least partially electrically charged substance mixture is configured by a voltage source, a first electrode and a second electrode being electrically connected to the voltage source, the electric potential difference of the electrically charged substance or of the at least partially electrically charged substance mixture being configured between the first and second electrode.

The voltage source may be configured such that the value of the potential difference of the electrically charged substance or of the at least partially electrically charged substance mixture may be adjusted statically or be changed dynamically.

The voltage source may be configured such that the equipment for spraying on the electrically charged substance or the at least partially electrically charged substance mixture is partly arranged between the first electrode and the second electrode, the second electrode being configured behind or below the substrate by the substrate and/or an electrode, and the first electrode being configured in parallel to the second electrode, wherein the part of the equipment to spray on the substance or substance mixture between the first electrode and the second electrode which deposits the electrically charged substance or the at least partially electrically charged substance mixture is, e.g., configured as a nozzle.

The nozzle may be configured as the first electrode.

The nozzle may be configured such that the electrically charged substance and the at least partially electrically charged substance mixture may be deposited on the substrate surface as an aerosol.

The device may be configured such that the electric potential difference of the electrically charged substance or of the at least partially electrically charged substance mixture is configured by an electrically charged atomized substance or by an electrically charged atomized substance mixture.

The substance or the substance mixture or a part of the substance mixture may comprise an intrinsic electric charge.

The device may be configured such that the substance or the substance mixture or a part of the substance mixture may be electrostatically charged.

The electric potential difference of the electrically charged substance or of the at least partially electrically charged substance mixture may be configured by an electrostatic charging of the substrate holder and/or the substrate.

The equipment for spraying on the substance or substance mixture may comprise a nozzle, the nozzle being connected to a container, the container providing the substance or substance mixture, and the nozzle and the container being configured such that the substance or substance mixture is transported from the container to the nozzle.

The equipment for spraying on the substance or substance mixture may be configured such that the substance or substance mixture is sprayed on by pressure from the nozzle.

The device may be configured such that the substrate and the nozzle may be shifted relative with regard to each other.

The equipment to spray on the electrically charged substance or the at least partially electrically charged substance mixture may be configured such that the first area may be adjusted by changing the distance between the nozzle and the substrate.

The equipment for spraying on the electrically charged substance or the at least partially electrically charged substance mixture may be configured such that the first area may be adjusted by changing the jet profile.

The device may be configured such that a ray optics is configured between the nozzle and the substrate surface.

The ray optics may be configured such that the shape of the jet of the substance or substance mixture may be changed by the ray optics, with the first area being adjusted by the jet shape, i.e., the area of the jet on the substrate surface.

The ray optics may at least comprise a static electric field or a dynamic electric field or an electromagnetic field.

The ray optics may be configured such that the opening angle of the jet may be changed by the ray optics.

The ray optics may comprise one or a plurality of electromagnetic lenses.

The ray optics may be moved electrically or electronically.

The ray optics may be configured as a first metallic plate and as a second metallic plate, the metallic plates being coplanarly arranged at a distance from each other, with the jet running between the plates.

The first metallic plate may comprise the same or a different electric potential as/than the second metallic plate.

The ray optics may comprise a metallic ring, wherein the ring may be electrically connected to a further voltage source, with the jet running through the ring aperture.

The ray optics may additionally comprise electrically acting blinds and/or mechanically acting blinds to contain the jet.

The device may be configured such that the amount of electrically charged substance or of the at least partially electrically charged substance mixture locally deposited on the substrate surface and/or the area of the jet on the substrate surface is coupled to a measurement of the local layer thickness of the already sprayed-on fluorescent layer.

In the following detailed description, reference is made to the accompanying drawings which form a part thereof and in which, for the sake of illustration, specific examples are shown by which our methods and devices may be realized. In this respect, information on directions such as "top," "bottom," "front," "back" and the like is used with reference to the orientation of the described drawing(s). Since components of examples may be positioned in a number of various orientations, the direction information serves to illustrate our methods and devices and is in no way limiting. It is clear that other examples may be used and that structural and logical modifications may be carried out without exceeding the scope of protection of the appended claims. It is clear that the features of the examples described herein may be combined with one another unless any specific information to the contrary is given. The following detailed description is thus not to be understood in a limiting sense and the scope of protection is defined by the appended claims.

The terms "connected" and "contacted" as well as "coupled" are used to describe a direct as well as an indirect connection, a direct or indirect contact as well as a direct or indirect coupling. In the Figures, identical or similar elements are thus provided with identical reference numerals, wherever suitable.

FIG. 1 shows a schematic cross-sectional view of a device 100 to configure layers of optoelectronic components according to various examples.

FIG. 1 shows a substrate holder 102 on which a substrate 104 has been fixed. The substrate 104 may, e.g., be a partially configured optoelectronic component, e.g., during manufacturing. A partially configured optoelectronic component may in this context already be the carrier of an optoelectronic component if an optoelectronic component is configured on or above the carrier. A partially configured optoelectronic component, however, may also be an optoelectronic component which is complete in itself with regard to other optoelectronic target properties, the optoelectronic properties of which are to be adapted to a specific optoelectronic target property.

The substrate 104 may comprise a single optoelectronic component, e.g., a singularized chip, or a plurality of optoelectronic components arranged side-by-side, e.g., on a chip wafer or on a panel. In already configured layers on a carrier (not shown), the substrate 104 may comprise a chip wafer, a wire-bonded ceramic material, a lead frame or the like as a carrier.

The device may comprise a nozzle 106 over the substrate 104. By this nozzle 106, a container may be connected to a substance or substance mixture (not shown), wherein the container and the nozzle 106 may be configured such that the substance or substance mixture may be transported from the container to the nozzle 106.

The substance or substance mixture may be sprayed from the nozzle 106 by pressure, e.g., an overpressure, e.g., by a pump or by negative pressure, e.g., by evacuating the space between the nozzle 106 and the substrate 104. The substance or, respectively, the substance mixture may thereby form a divergent jet 108. The divergent jet 108 may in this context be directed to the substrate surface 104 to be coated.

In this context, the nozzle 106 may have an opening diameter of about 20 µm to about 6 mm, wherein the opening diameter of the nozzle 106 may depend on the viscosity of the substance or substance mixture, on the size of possible particles of the jet 108 of the substance or substance mixture and on the applied pressure.

A lower viscosity of the sprayed-on substance or substance mixture may be important for spraying, e.g., in an uncured polymer such as an epoxy resin, a silicone or a substance mixture of one of these substances comprising a fluorescent substance. Instead or in addition, the substance mixture may comprise volatile components such as solvents.

By chemically curing a part of the sprayed-on substance or substance mixture and/or an evaporation or, respectively, vaporization of volatile parts of the sprayed-on substance mixture, the viscosity of the sprayed-on substance or substance mixture may be increased.

The pressure by which the substance or the substance mixture is sprayed from the nozzle 106 may have a value of about 0.1 bar to about 10 bar.

Between the atomized substance or substance mixture and the substrate 104, an electric potential difference may be configured, e.g., by electrostatic charging of the substrate holder 102 and/or the substrate 104; and/or by an electrically charged, atomized substance or electrically charged atomized substance mixture such as a fluorescent substance, wherein the substance or substance mixture or a part of the substance mixture may be electrostatically charged and/or may obtain electrostatic charging, e.g., by a voltage source 110, wherein the voltage of the voltage source 110 may be applied between:

the nozzle 106 and the substrate 104 and/or an electrode behind or, respectively, below the substrate 104, e.g., at the substrate holder 102, or between an electrode behind or above the nozzle 106, e.g., the holder (not shown) of the nozzle 106, and the substrate 104 and/or an electrode behind or below the substrate 104, e.g., the substrate holder 102.

An electrode behind or below the substrate 104, e.g., an electrically charged substrate holder 102, and/or an electrostatic charging of the substrate 104 may, e.g., be configured for electrically non-conductive substrates 102, e.g., the surfaces of a sapphire semiconductor chip or a conductive but non-grounded semiconductor chip, chip wafer or panel.

The value of the potential difference, i.e., the voltage may be statically or dynamically configured, wherein the voltage may comprise a value of about −40 kV to about +40 kV, e.g., about −2 kV to about +2 kV, e.g., about −400 V to about +400 V, e.g., about −50 V to about +50 V.

The directed jet may have an area 112 on the substrate 104 which may be adjusted by the distance 114 of the nozzle 106 from the substrate surface 104 and/or the pressure value of the substance or substance mixture sprayed from the nozzle 106. The distance 114 between the nozzle 106 and the substrate surface 104 may have a value of about 0.5 cm to about 30 cm, e.g., 1 cm.

When suitably choosing the potential difference, the sprayed-on electrically charged substance or the sprayed-on at least partially electrically charged substance mixture or a part of the sprayed-on electrically charged substance mixture such as a fluorescent substance may be attracted by and held on the surface electrically, e.g., electrostatically. In addition, the electrically attracted substance may have an insulating effect for a further sprayed-on electrically charged substance or a further sprayed-on, at least partially electrically charged substance mixture. Further sprayed-on electrically charged substance such as a further fluorescent substance may preferably accumulate locally on the substrate surface 104, where no or little electrically charged substance, e.g., electrically charged fluorescent substance, has been deposited.

The sprayed-on substance or parts of the sprayed-on substance mixture, e.g., particles, e.g., fluorescent particles, may have an electric charge, e.g., a surface charge.

The sprayed-on substance or parts of the sprayed-on substance mixture, e.g., particles, e.g., fluorescent particles, may be electrostatically charged by the electric potential of the nozzle 106 and the friction occurring during spraying.

The sprayed-on substance mixture may be configured as a fluorescent substance in a matrix substance, e.g., a suspension or dispersion, wherein the substance of the matrix may comprise or be composed of a silicone, a lacquer or a resin.

The sprayed-on substance mixture may be configured as a fluorescent substance in a matrix substance, e.g., a suspension or dispersion, the matrix substance comprising a volatile solvent. The solvent may partly or completely evaporate or, respectively, escape during spraying or from the sprayed-on layer. The evaporation or, respectively, escaping of solvent from the sprayed-on layer may be configured by a negative pressure and/or a heating of the sprayed-on layer and/or of the substrate 104.

The substrate surface 104 may be partially or completely coated by a partial or complete adjustment of the area 112 of the jet to the size of the substrate surface 104, e.g., by adjusting the distance 114 between the nozzle 106 and the substrate 104. If the distance 114 is consistent, the area 112 may be adjusted by adjusting the opening angle of the jet 108.

The substrate 104 and the nozzle 106 may be shifted relative to each other to coat the substrate surface 104, e.g., by moveably arranging the nozzle 106 and/or the substrate 104 or, respectively, the substrate holder 102. The relative shift may be carried out, e.g., electrically, e.g., by electric motors, or electronically, e.g., by computer-controlled electric motors (not shown).

By the forming of the layers on the substrate 104 by an electric field, a more homogenous layer thickness distribution may be configured on the substrate 104 than without an electric field. Moreover, spreading and/or removing of the sprayed-on layer, e.g., of the fluorescent composite material, from the substrate surface 104 may be reduced and/or avoided to the greatest possible extent by the electrical forces of attraction. Thereby, e.g., during spraying on a fluorescent layer, a more homogenous distribution of the chromaticity coordinate of a plurality of optoelectronic components may be achieved on a shared substrate 104.

Furthermore, complex substrate shapes may be shaped, slowing down or preventing spreading, e.g., at vertical locations of the substrate 104.

Furthermore, the electrically charged substances or electrically charged parts of the substance mixture, e.g., fluorescent substances, may be more densely packaged by the electric force. The denser packaging may improve the heat conductivity, e.g., of a sprayed-on phosphorus layer, and cause or provide a more efficient cooling of components.

By spraying a fluorescent substance in a volatile matrix, e.g., in a solvent suspension or a solvent dispersion, the fluorescent substance may be deposited on the substrate 104 as a layer without surrounding matrix since the matrix substance is volatile, i.e., may evaporate or escape. Thereby, the heat dissipation of the Stokes heat occurring in a fluorescent substance for wavelength conversion may be improved. The Stokes heat may in this context be considered to be the energy difference between the electromagnetic radiation absorbed by the fluorescent substance and the emitted electromagnetic radiation.

Figure 2:
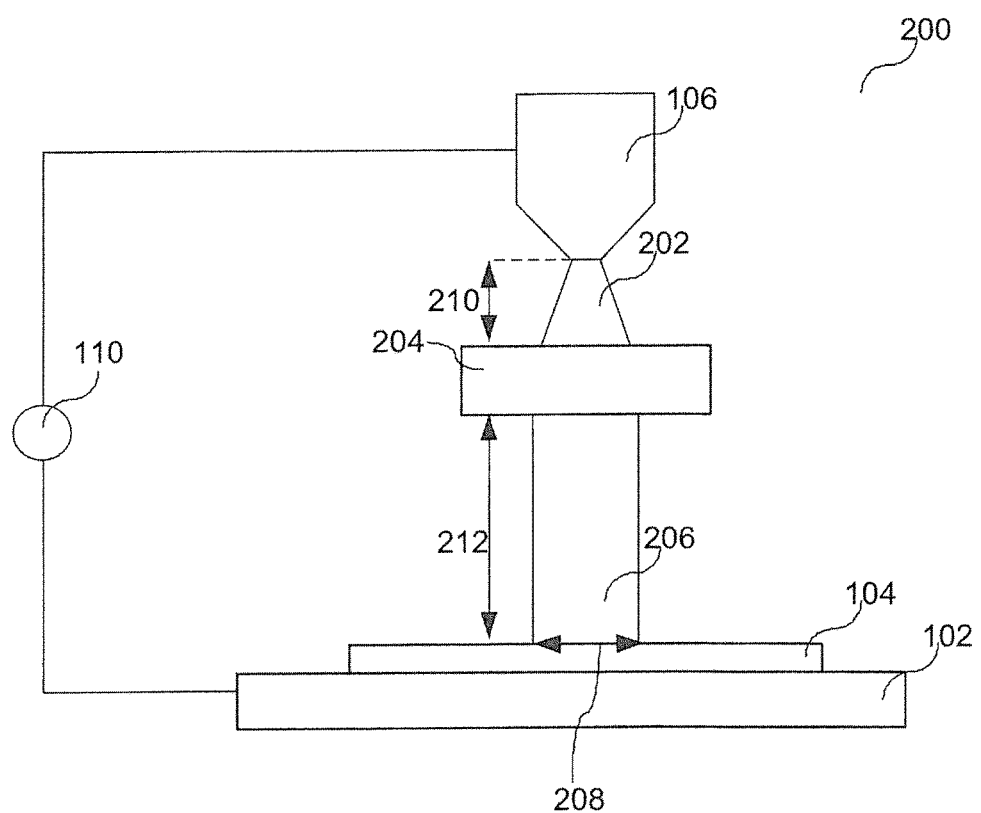
FIG. 2 shows a schematic cross-sectional view of a device for producing layers of optoelectronic components, according to various examples.

FIG. 2 shows a schematic sectional view of a device 300 to generate layers of optoelectronic components according to various examples.

In addition to FIG. 1, the device may comprise a ray optics 204 between the nozzle 106 and the substrate 104. The ray optics 204 may shape the divergent jet 202 sprayed from the nozzle 106, e.g., focus or collimate it, and form a directed jet 206.

Depending on the composition of the atomized substance or substance mixture or, respectively, on the composition of the substrate 104, the ray optics 204 may be configured by a static or dynamic electric or, respectively, magnetic field. Thereby, a different electromagnetic field may be applied between the nozzle 106 and the substrate 104 than in the region of the ray optics 204 and thus, the divergent jet 108 may be modulated, e.g., the ray optics 204 may be grounded and according to an example of the description of FIG. 1, a voltage may be applied between the nozzle 106 and the substrate 104. Thus, compared to the development of the electric field between the nozzle 106 and the substrate 104, the electric field may be limited without ray optics 204.

The ray optics 204 may in this context be configured as one or a plurality of electromagnetic lenses comprising a static or dynamic electromagnetic field, or as a permanent magnet.

The ray optics 204 may at least comprise an electrically acting blind and/or a mechanically acting blind to delimit the jet.

On the substrate 104, the directed jet may have an area 208 which may be adjusted by the image distance 212 and the ray optics 204, e.g., by the focal distance and the effect of the lens on the jet 202, e.g., collecting effect or dispersing effect.

The adjustment of the area 208 by the ray optics 204 may in this context be coupled to the pressure value of the substance or substance mixture sprayed from the nozzle 106.

By the ray optics 204, the region of the substrate surface 104 which has been sprayed with the electrically charged substance or the at least partially electrically charged substance mixture may be specifically adjusted, e.g., to deposit a fluorescent substance on small selected substrate areas 104 only, e.g., to not spray the ceramic borders of a panel with fluorescent substance or to compensate for inhomogeneities of the sprayed-on layer thickness.

The compensation of layer thickness inhomogeneities may, e.g., be configured after a first spraying process and a local measurement of the thickness of the fluorescent layer sprayed onto the substrate surface in a second spraying process carried out locally by the measured layer thickness information and the ray optics 204.

The jet area 208 may in this context be adjusted dynamically by the ray optics 204, the voltage source 110 and the distance 212 between the ray optics 204 and the substrate 104.

The ray optics 204 may be arranged moveably and moved electrically or electronically. The movements of the ray optics 204 may in this context be configured in parallel, perpendicularly or at an angle, e.g., diagonally, with respect to the substrate surface.

Figure 3:
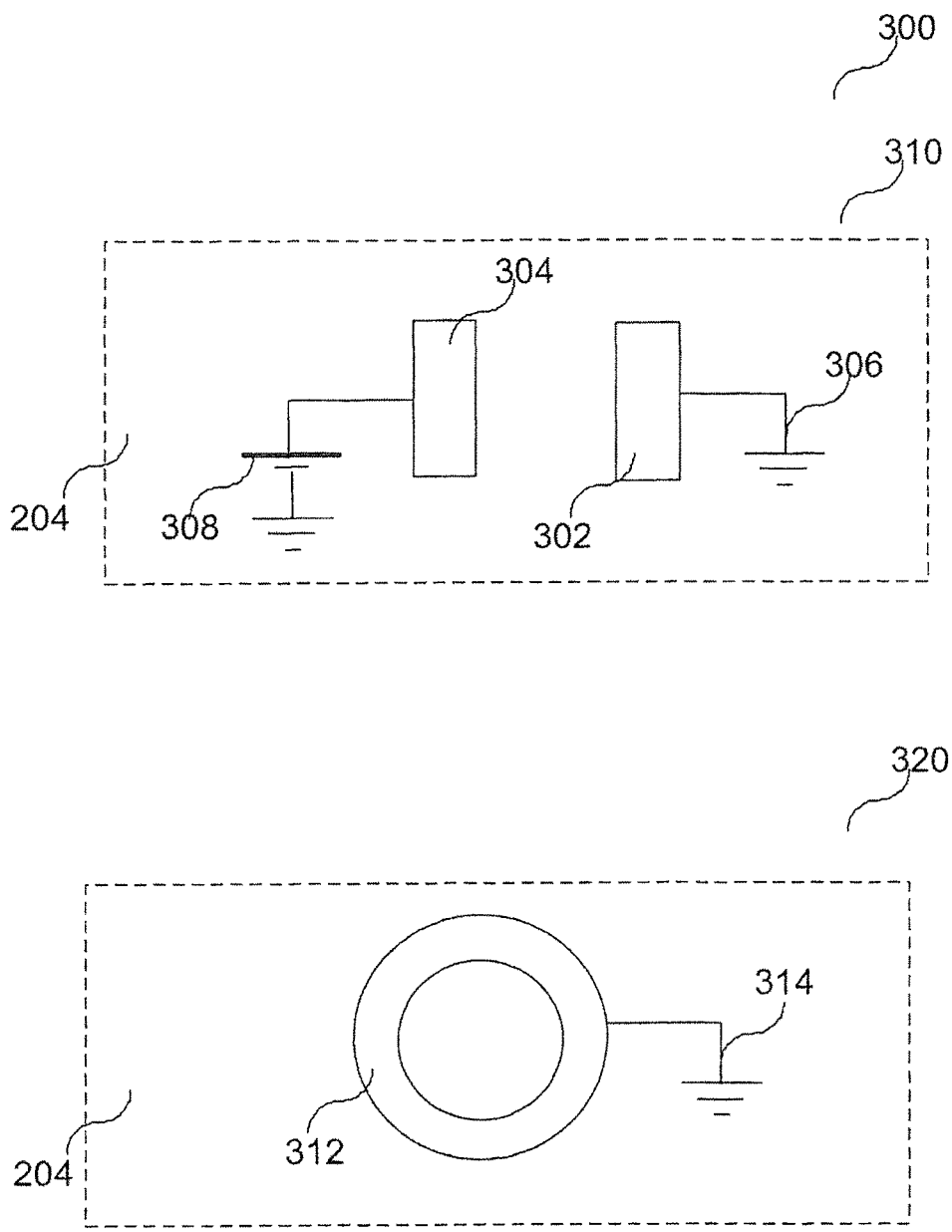
FIG. 3 depicts examples of ray optics.

FIG. 3 shows examples 300 of ray optics 204 according to various examples.

In FIG. 3, a first example 310 and a second example 320 for a ray optics 204 are depicted in two top views 310, 320, wherein the depicted ray optics 310, 320 may also be configured as individual ray lenses of a more complex ray optics 204, e.g., by serially connected lenses, e.g., according to the first example or the second example.

The first example of the ray optics 204 may be configured as a first metallic plate 302 and a second metallic plate 304, the metallic plates 302, 304 being arranged e.g., coplanarly with regard to each other. The metallic plates may comprise metals and/or precious metals as a substance or alloy, or be composed thereof, e.g., Fe, Cu, Au, Ag, Pt, Pd, Al, Ti or C (graphite) and may comprise a size of approximately 10×10 cm$^2$.

The two metallic plates 302, 304 may be set up such that an electric potential difference 306, 308, i.e., an electric field is configured between the two plates. Both plates may, however, have the same electric potential 306, 308, e.g., be grounded.

If a differing electric potential 306, 308 is applied between the metallic plates 302, 304, e.g., the first metallic plate 302 may be earthed, e.g., connected to ground, while the second metallic plate 304 may be connected to a voltage source 308. The electric field between the first metallic plate 302 and the second metallic plate 304 may be configured statically or dynamically and be configured for modulating the jet 202 of the sprayed-on electrically charged substance or of the at least partially electrically charged substance mixture.

The metallic plates 302, 304 may have a distance with regard to each other of about 10 mm to about 20 cm, a distance 201 from the nozzle 106 of about 5 mm to about 5 cm, and a distance 212 to the substrate surface 104 of about 1 mm to about 1 cm, e.g., 1 cm.

In a second example, the ray optics 204 may be configured as a metallic ring 312. The metallic ring may comprise metals and/or precious metals as a substance or alloy, or be composed thereof, e.g., Fe, Cu, Au, Ag, Pt, Pd, Al, Ti or C (graphite) and an internal diameter of about 1 mm to about 1 cm and an external diameter of about 1 mm to about 10 cm, with a thickness of about 1 mm to about 3 cm.

The ring 312 may be electrically connected to a voltage source 110, wherein the ring 312 may be earthed, i.e., connected to ground.

The metallic ring 312 may have a distance 210 with regard to the nozzle 106 of about 1 mm to about 5 cm, and a distance 212 with regard to the substrate surface 104 of about 1 mm to about 5 cm, e.g., 1 cm.

Figure 4:
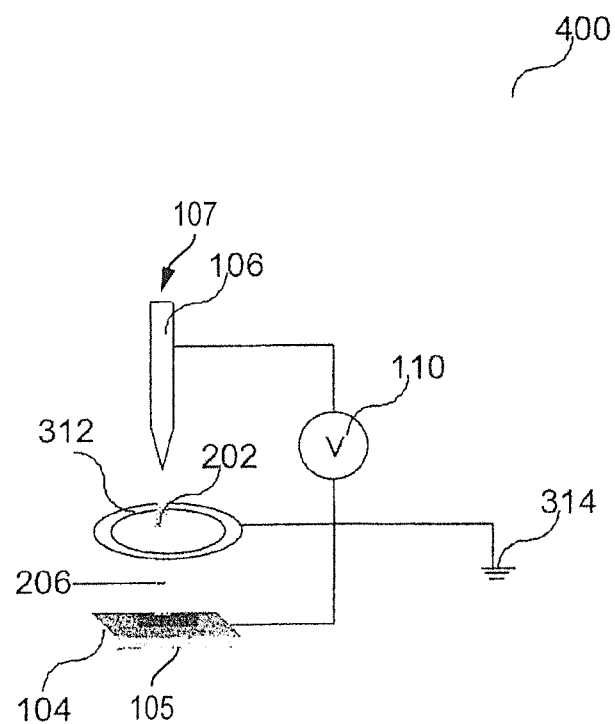
FIG. 4 shows examples of the device.

FIG. 4 depicts an example of the device according to various examples.

In the depicted example of FIG. 4, an LED panel 104 may be set up as a first electrode 105, wherein the LED chips on the panel 104 may be electrically contacted by the backside of the chip. The counterpart to the first electrode 105 (i.e., the second electrode 107) may be configured directly behind the spray nozzle 106. By a voltage source 110, an electric field may be applied between the electrodes and, subsequently, a jet 202 of a silicone-fluorescent suspension may be applied to the panel 104 in a plurality of layers. The silicone-fluorescent suspension may thereby have a polydimethyl siloxane silicone as a matrix, the viscosity of which is about 0.5 Pas and the weight percent of the fluorescent substance with regard to the silicone-fluorescent suspension being about 40% to about 80%, e.g., about 50%.

The jet 202 from the nozzle 106 may in this context configure a collimated jet 206 by the grounded 314 metallic ring 313, the jet 206 being directed to the substrate surface 104.

After reaching the target thickness of the fluorescent substance layer, the panel 104 may be cast with a lens, i.e., be provided with a lens by casting (not shown). Subsequently, the LED chips from the panel may be singularized and thus configure a finished LED.

In various examples, devices and a method of their production are provided by which it is possible to configure a more homogeneous layer thickness distribution on the substrate by the electric-field-aided forming of the fluorescent substance layers on a substrate than without an electric field. Moreover, spreading and/or removing of the sprayed-on fluorescent substance layer, e.g., of the fluorescent composite, from the substrate surface may be reduced and/or prevented to the greatest possible extent by the electric forces of attraction. Thereby, e.g., when spraying on a fluorescent substance layer, a homogeneous distribution of the chromaticity coordinate of a plurality of optoelectronic components may be configured on a shared substrate. Furthermore, more complex substrate shapes may be formed while slowing down or preventing spreading, e.g., at vertical positions of the substrate. Moreover, the electrically charged substances or the electrically charged parts of the substance mixture, e.g., fluorescent substances, may be more densely packaged by the electric force. The denser packaging may result in an improvement of the heat conductivity, e.g., of a sprayed-on phosphorus layer, and provide a more efficient component cooling. By spraying a fluorescent substance in a volatile matrix, e.g., in a solvent suspension or a solvent dispersion, the fluorescent substance may be deposited on the substrate as a layer without surrounding matrix since the matrix substance is volatile, e.g., may evaporate or escape. As a result, the heat dissipation of the Stokes heat occurring in a fluorescent substance for wavelength conversion may be improved. The Stokes heat may in this context be the energy difference between the electromagnetic radiation absorbed by the fluorescent substance and the emitted electromagnetic radiation.

The invention claimed is:

1. A method of manufacturing optoelectronic components comprising:

spraying an electrically charged substance or an at least partially electrically charged substance mixture through a nozzle under pressure onto a substrate to form a fluorescent layer comprising an electric charge when sprayed on, wherein the electrically charged substance or the at least partially electrically charged substance mixture occupies a space wherein the electric potential is greater than the electrical potential of the substrate;

locally adjusting the thickness of the fluorescent layer of the sprayed-on fluorescent substance when spraying on the fluorescent layer onto the substrate by an electric potential gradient;

measuring a local layer thickness of the applied fluorescent layer; and locally adjusting an amount of the electrically charged substance or the at least partially electrically charged substance mixture by a ray optics based on the measured layer thickness information, wherein the ray optics can shape or direct the jet of the substance or substance mixture, wherein an electric potential difference is generated by a voltage source and one electric potential value of the electric potential difference is of the electrically charged substance or the at least partially electrically charged substance mixture and one of an electric potential difference is an electric potential value of the substrate, a first electrode and a second electrode electrically connect to the voltage source, and the electric potential difference is configured between the first and the second electrode, and wherein the electric potential difference is configured by an electrically charged sprayed-on substance or an at least partially electrically charged sprayed-on substance mixture and an earthed substrate, and the electric potential difference is configured by electrostatically charging the substrate holder and/or the electrically charged sprayed-on substance or at least partially electrically charged sprayed-on substance mixture on the substrate.

2. The method of claim 1, wherein the optoelectronic components are light-emitting diodes or laser diodes.

3. The method of claim 1, wherein the at least partially electrically charged substance mixture is sprayed onto the substrate comprising a matrix and a fluorescent substance embedded therein.

4. The method of claim 3, wherein the substance of the matrix of the substance mixture comprises a volatile solvent or being composed thereof.

5. The method of claim 3, wherein the substance of the matrix of the substance mixture comprises a volatile solvent or being composed thereof, and the volatile solvent is vaporized and/or escapes from the surface of the substrate by negative pressure and/or by heating the sprayed-on layer and/or by heating the substrate.

6. The method of claim 1, wherein the substance or substance mixture is deposited on the substrate by a nozzle, the substance or substance mixture being sprayed from the nozzle by pressure.

7. The method of claim 1, wherein the substance or substance mixture is an organic substance.

8. The method of claim 1, wherein the electric potential difference is configured by an electrically charged sprayed-on substance or an at least partially electrically charged sprayed-on substance mixture and an earthed substrate.

9. The method of claim 1, wherein the electrically charged substance or the at least partially electrically charged substance mixture comprises an intrinsic electrical charge.

10. The method of claim 1, wherein the electrically charged substance or the at least partially electrically charged substance mixture comprises an intrinsic electrical charge, and the substance or substance mixture or a part of the substance mixture is electrostatically charged prior to or during spraying onto the substrate.

11. A device that manufactures an optoelectronic component comprising:
equipment that generates an electric potential difference;
a substrate holder that holds a substrate; and
equipment that sprays an electrically charged substance or an at least partially electrically charged substance mixture through a nozzle under pressure to form a jet of the electrically charged substance or the at least partially electrically charged substance mixture, configured to adjust the thickness of the sprayed-on electrically charged substance or the sprayed-on at least partially electrically charged substance mixture by various electrical changes of potential on the substrate;
measures a local layer thickness of the applied fluorescent layer; and
locally adjusts an amount of the electrically charged substance or the at least partially electrically charged substance mixture by a ray optics based on the measured layer thickness information, wherein the ray optics can shape or direct the jet of the substance or substance mixture,
wherein the equipment that generates an electric potential difference comprises a voltage source that generates the electric potential difference which is configured between a first electrode and a second electrode electrically connected to the voltage source and one electrical potential value of the electric potential difference is of the electrically charged substance or the at least partially electrically charged substance mixture and another electrical potential value of the electric potential difference is of the substrate, and
the equipment that generates an electric potential difference generates the electric potential difference configured by the electrically charged sprayed-on substance or the at least partially electrically charged sprayed-on substance mixture and an earthed substrate, and the electric potential difference is configured by electrostatically charging the substrate holder and/or the electrically charged sprayed-on substance or at least partially electrically charged sprayed-on substance mixture on the substrate.

12. The device of claim 11, wherein the at least partially electrically charged substance mixture deposited on the substrate comprises a matrix and a fluorescent substance embedded therein.

13. The device of claim 11, wherein the substrate holder and the nozzle are arranged to be moveable relative to each other.

14. The device of claim 11, wherein ray optics are configured between the nozzle and the substrate holder.

* * * * *